United States Patent
Wang et al.

(10) Patent No.: US 9,110,133 B2
(45) Date of Patent: Aug. 18, 2015

(54) RECONFIGURABLE CIRCUIT AND DECODER THEREFOR

(71) Applicants: Ling Wang, Suzhou (CN); Huangsheng Ding, Suzhou (CN); Shayan Zhang, Cedar Park, TX (US); Wanggen Zhang, Suzhou (CN)

(72) Inventors: Ling Wang, Suzhou (CN); Huangsheng Ding, Suzhou (CN); Shayan Zhang, Cedar Park, TX (US); Wanggen Zhang, Suzhou (CN)

(73) Assignee: FREESCALE SEMICONDUCOTR, INC., Austin, TX (US)

( * ) Notice: Subject to any disclaimer, the term of this patent is extended or adjusted under 35 U.S.C. 154(b) by 0 days.

(21) Appl. No.: 14/277,053

(22) Filed: May 14, 2014

(65) Prior Publication Data

US 2015/0048863 A1    Feb. 19, 2015

(30) Foreign Application Priority Data

Aug. 19, 2013    (CN) .......................... 2013 1 0564207

(51) Int. Cl.
  *G01R 31/3177* (2006.01)
  *G01R 31/317* (2006.01)
  *H04L 25/49* (2006.01)

(52) U.S. Cl.
  CPC ...... *G01R 31/31701* (2013.01); *G01R 31/3177* (2013.01); *H04L 25/4902* (2013.01)

(58) Field of Classification Search
  None
  See application file for complete search history.

(56) References Cited

U.S. PATENT DOCUMENTS

| 4,503,472 | A | * | 3/1985 | Lacher | ........................... 360/43 |
| 6,232,796 | B1 | | 5/2001 | Batra et al. | |
| 6,421,812 | B1 | | 7/2002 | Wang | |
| 6,809,664 | B1 | | 10/2004 | Pereira | |
| 7,839,963 | B2 | * | 11/2010 | Warren | ......................... 375/355 |
| 2008/0278189 | A1 | | 11/2008 | Hur | |
| 2009/0240460 | A1 | | 9/2009 | Hur | |
| 2012/0019273 | A1 | | 1/2012 | Turner | |
| 2013/0193899 | A1 | * | 8/2013 | Kurosawa | ..................... 318/504 |

FOREIGN PATENT DOCUMENTS

CN    101387686    3/2009

* cited by examiner

*Primary Examiner* — Jany Richardson
(74) *Attorney, Agent, or Firm* — Charles Bergere; Shayan Zhang (57) ABSTRACT

A digital decoder, used in a reconfigurable circuit, for decoding digital pulses includes a phase indicator module having inputs coupled to a reference pulse input and a data pulse input. The phase indicator module has timing information outputs that provide logic values indicative of rising and falling edges of pulses occurring on the reference pulse input and the data pulse input. A phase decoder module has inputs coupled to the timing information outputs, and outputs decoded binary data values. In operation, the phase decoder module compares at least two of the logic values at the timing information outputs with a signal representative leading and trailing edges of a pulse applied to one of the phase inputs to determine a pulse arrival order sequence on the phase inputs and thereby provide the decoded binary data values.

20 Claims, 10 Drawing Sheets

RECONFIGURABLE CIRCUIT AND DECODER THEREFOR

BACKGROUND OF THE INVENTION

The present invention relates to a decoder for decoding digital pulses, and reconfigurable circuit that includes a digital pulse decoder.

Semiconductor die packages are being manufactured with increased circuit functionality to package pin count (external terminal count). However, due to the limited number of external terminals or pins, the controllability and observablity of internal circuit nodes can often be inadequate unless testability is designed into the circuit.

Testability is designed into circuits by the use of dedicated test pins. These dedicated test pins are often used in structured Design For Testability (DFT) techniques such as Scan Path, Level Sensitive Scan Design (LSSD), Built In Self-Test (BIST) and Random Access Scan. However, because the number of external pins is limited, these dedicated test pins are provided at the cost of reduced functionality and normal run-time accessibility of functional modules of the circuit.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element proceeded by "comprises . . . a" does not, without more constraints, preclude the existence of additional identical elements that comprises the element.

In one embodiment, the present invention provides for a method of decoding digital pulses received at phase inputs of a decoder, digital pulses being a reference pulse and at least one data pulse. The method includes detecting an occurrence of the reference pulse received at one of the inputs and the data pulse received at another of the inputs. There is then performed a process of comparing arrival timing information of the reference pulse and arrival timing information of the data pulse to determine a pulse arrival order sequence. The method provides decoded binary data values at outputs of the decoder, the decoded binary data values being dependent on at least the pulse arrival order sequence.

In another embodiment the present invention provides for digital pulse decoder with at least two phase inputs in the form of a reference pulse input and a data pulse input. The decoder includes a phase indicator module having inputs coupled to the reference pulse input and the data pulse input, wherein the phase indicator module has timing information outputs that provide logic values indicative of rising and falling edges of pulses occurring on the reference pulse input and the data pulse input. The decoder also includes a phase decoder module having inputs coupled to the timing information outputs, and outputs that provide decoded binary data values. In operation, the phase decoder module compares at least two of the logic values at the timing information outputs with a signal representative a leading and a trailing edge of a pulse applied to one of the phase inputs to determine a pulse arrival order sequence on the phase inputs and thereby provides the decoded binary data values.

In yet a further embodiment the present invention provides for a reconfigurable circuit including a digital pulse decoder and at least one functional module providing at least some outputs of the circuit. The circuit has at least two phase inputs in the form of a reference pulse input and a data pulse input coupled to inputs of both the digital pulse decoder and at least one functional module. The digital pulse decoder includes a phase indicator module having inputs coupled to the reference pulse input and the data pulse input, wherein the phase indicator module has timing information outputs that provide logic values indicative of rising and falling edges of pulses occurring on the reference pulse input and the data pulse input. The decoder also includes a phase decoder module having inputs coupled to the timing information outputs, and outputs that provide decoded binary data values. In operation, the phase decoder module compares at least two of the logic values at the timing information outputs with a signal representative a leading and a trailing edge of a pulse applied to one of the phase inputs to determine a pulse arrival order sequence on the phase inputs and thereby provides the decoded binary data values.

Figure 1:
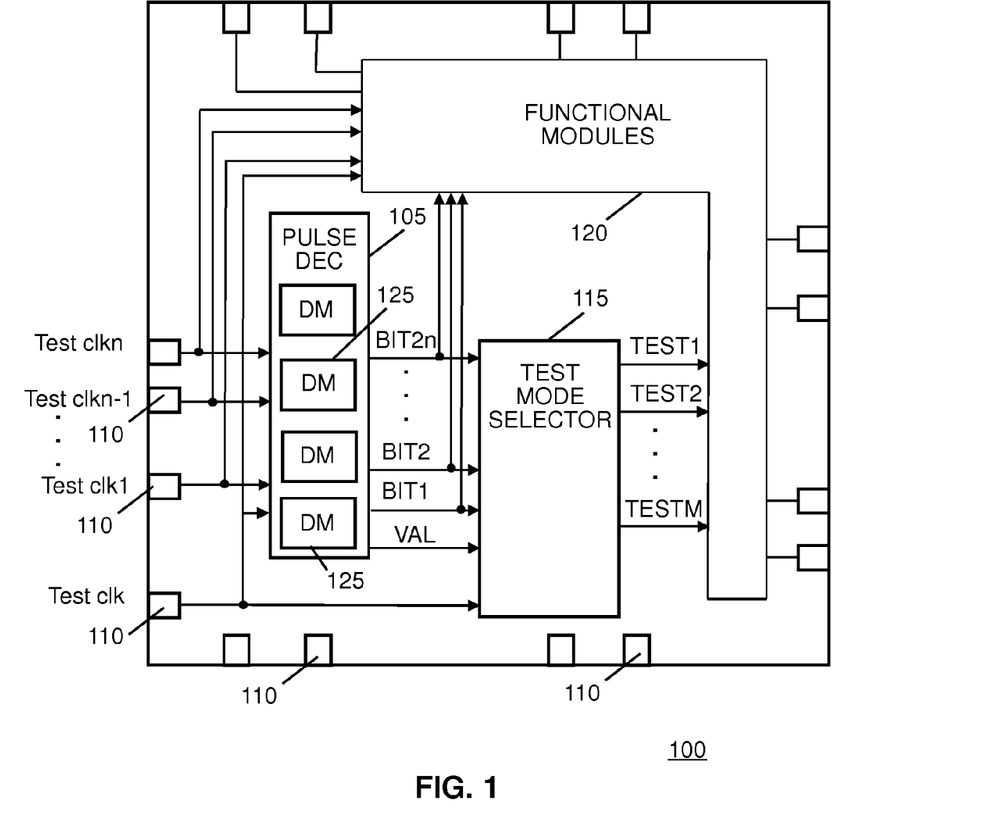
FIG. 1 is a schematic circuit diagram of a reconfigurable electronic circuit in accordance with a preferred embodiment of the present invention.

Referring now to FIG. 1, a schematic circuit diagram of a reconfigurable electronic circuit 100 in accordance with a preferred embodiment of the present invention is shown. The circuit 100 includes a digital pulse decoder 105 that has phase inputs coupled to external terminals 110 of the circuit 100. Outputs of the pulse decoder 105 are selectively coupled to inputs of a test mode selector 115 that has test mode outputs TEST1 to TESTM coupled to DFT circuitry of functional modules 120 of the circuit 120. In operation, the test mode outputs TEST1 to TESTM send control commands to the DFT circuitry to thereby reconfigure the functional modules 120 into a selected test mode as will be apparent to a person skilled in the art. In other words the functional modules 120 operates in a non-test mode thereby processing digital data received at the phase inputs until the control command is sent to the functional module.

The phase inputs of the pulse decoder 105 are designated as a reference pulse input (Test clk) and data pulse inputs (Test clk1 to Test clkn) and the outputs of the pulse decoder 105 are designated as valid phase pulse sequence signal output (VAL) and decoded binary data outputs (BIT1 to BIT2n). As shown, the reference pulse input (Test clk) is also connected to an input of the test mode selector 115. Furthermore, the reference pulse input (Test clk) and data pulse inputs (Test clk1 to Test clkn) are coupled to nodes (normally inputs) of the functional modules 120 in the circuit 100. The functional modules also have outputs selectively coupled to the external terminals 110 and inputs that in this embodiment are suitable coupled to the decoded binary data outputs (BIT1 to BIT2n. As shown, the digital pulse decoder 105 includes pulse decoder modules 125 that provide the valid phase pulse sequence signal output (VAL) and decoded binary data outputs (BIT1 to BIT2n).

Figure 2A:
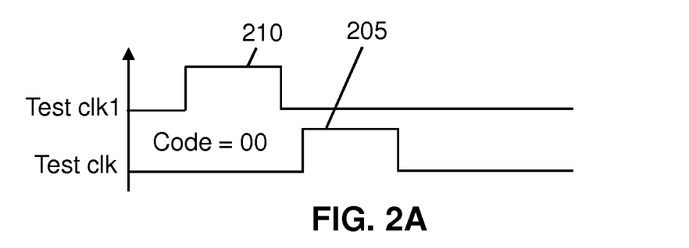
FIGS. 2A to 2D are timing diagrams illustrating coded digital pulses in accordance with a preferred embodiment of the present invention.

FIGS. 2A to 2D are timing diagrams illustrating coded digital pulses in accordance with a preferred embodiment of the present invention. In FIG. 2A the coded digital pulses show the reference pulse input (Test clk) receiving a reference pulse 205 that has risen after the data pulse input (Test clk1) receives a data pulse 210 that has risen and fallen. This phase sequence of pulses, as shown in FIG. 2A, represents a binary code 00.

Figure 2B:
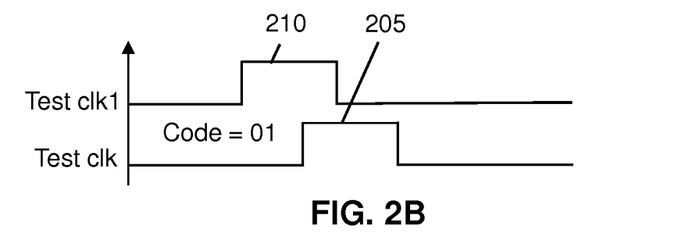

In FIG. 2B the coded digital pulses show the reference pulse input (Test clk) receiving a reference pulse 205 that has risen after the data pulse input (Test clk1) receives a data pulse 210. Also, the reference pulse 205 was received before the data pulse 210 has fallen and the data pulse 210 falls before the reference pulse 205 falls. This phase sequence of pulses, as shown in FIG. 2B, represents a binary code 01.

Figure 2C:
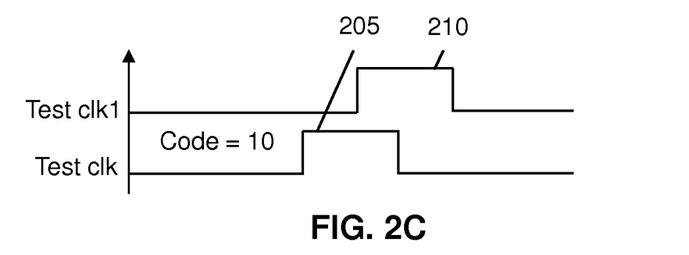

In FIG. 2C the coded digital pulses show the reference pulse input (Test clk) receiving a reference pulse 205 that has risen but not fallen before the data pulse input (Test clk1) receives a data pulse 210. Also, the reference pulse 205 falls before the data pulse 210 falls. This phase sequence of pulses, as shown in FIG. 2C, represents a binary code 10.

Figure 2D:
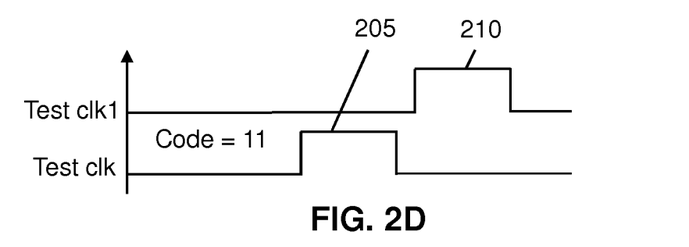

In FIG. 2D the coded digital pulses show the reference pulse input (Test clk) receiving a reference pulse 205 that has risen and fallen before the data pulse input (Test clk1) receives a data pulse 210. This phase sequence of pulses, as shown in FIG. 2D, represents a binary code 11.

Figure 3:
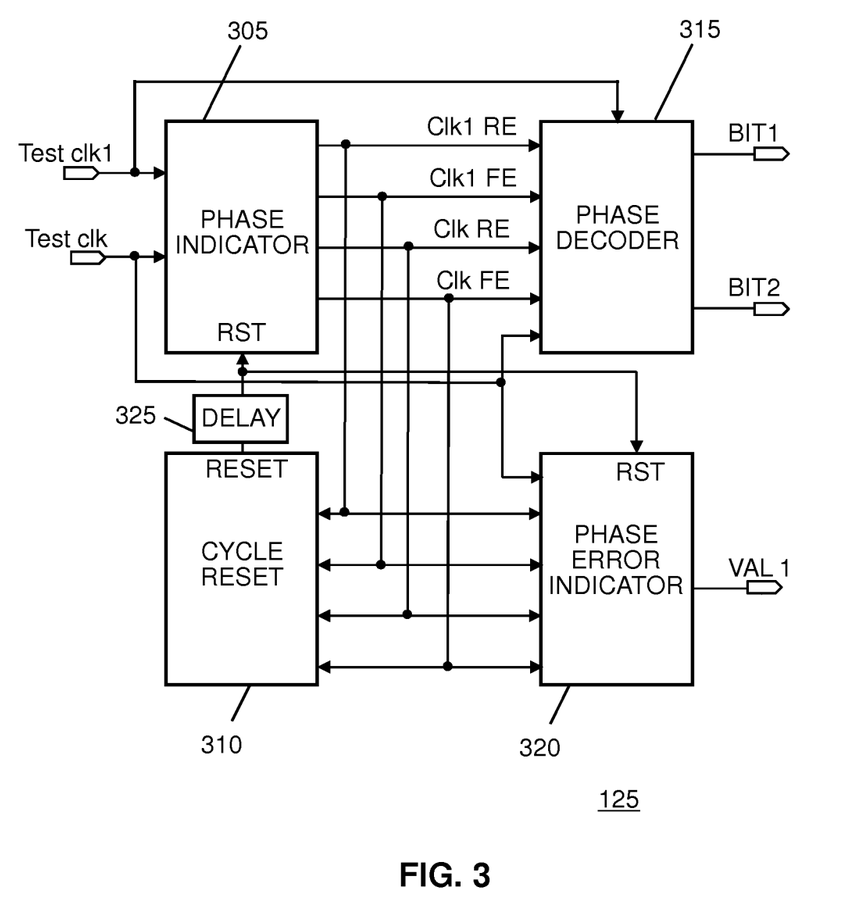
FIG. 3 is a schematic circuit diagram of a decoder module of a pulse decoder of the circuit of FIG. 1, in accordance with a preferred embodiment of the present invention.

FIG. 3 is a schematic circuit diagram of a decoder module 125 that forms part of the pulse decoder 105 in accordance with a preferred embodiment of the present invention. In this illustration the decoder module 125 includes a phase indicator module 305 having two inputs coupled respectively to the reference pulse input (Test clk) and one of the data pulse inputs (Test clk1). The phase indicator 305 also has a reset input (RST) and four timing information outputs (TI) which are: a reference pulse input rising edge indicator output (Clk RE); a reference pulse input falling edge indicator output (Clk FE); a data pulse input rising edge indicator output (Clk1 RE); and a data pulse input falling edge indicator output (Clk1 FE).

The timing information outputs (TI) of the phase indicator module 305 are coupled to inputs of a cycle rest module 310, a phase decoder module 315 and a phase error indicator module 320. Furthermore, the reference pulse input (Test clk) is coupled to inputs of the phase decoder module 315 and the phase error indicator module 320, and the data pulse input (Test clk1) is coupled to an input of the phase decoder module 315. The cycle reset module 310 has a RESET output coupled through a delay 325 to the reset inputs (RST) of the phase indicator module 305 and a phase error indicator module 320. The phase decoder module 315 has two outputs providing two of the decoded binary data outputs (BIT1 and BIT2), and the phase error indicator module 320 has a single valid phase pulse sequence signal output (VAL1). As will be discussed later, not all the inputs to the phase decoder module 315 are required and the actual inputs are dependent on the specific embodiment or implementation of the phase decoder module 315.

Figure 4:
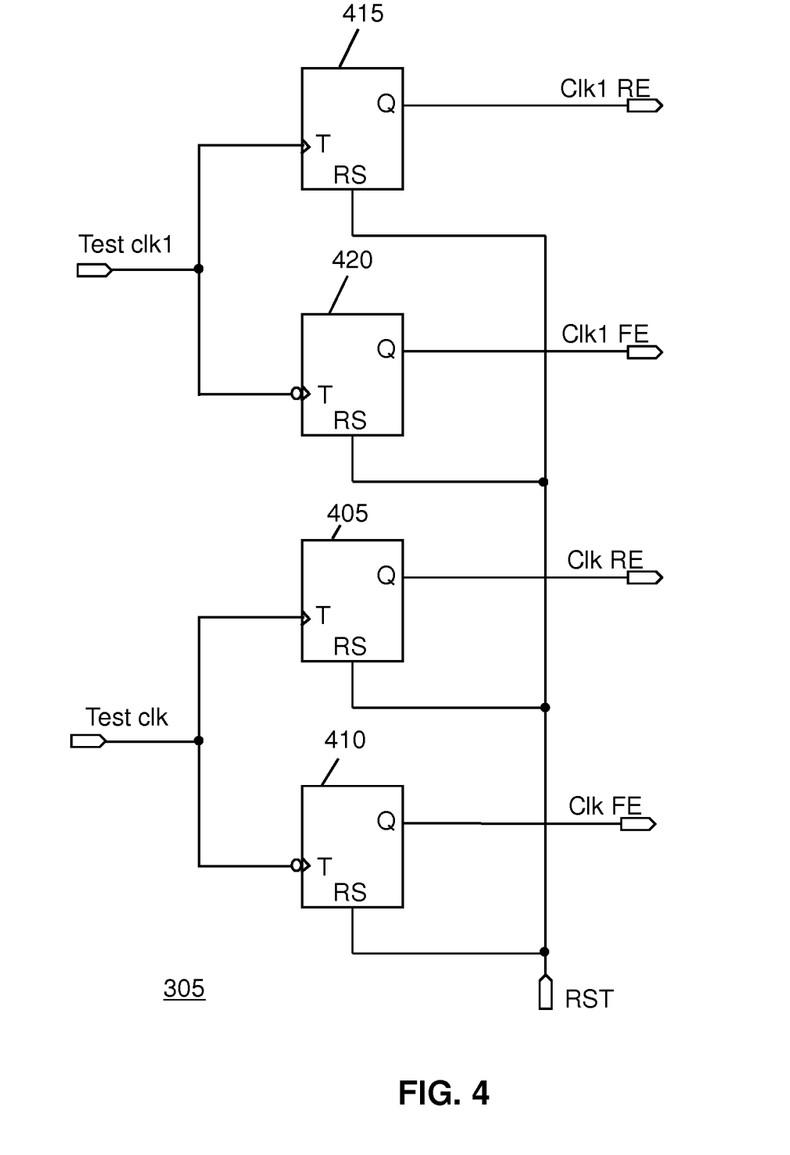
FIG. 4 is a schematic circuit diagram of a phase indicator module of the decoder module of FIG. 3, in accordance with a preferred embodiment of the present invention.

Referring to FIG. 4, a schematic circuit diagram of the phase indicator module 305 in accordance with a preferred embodiment of the present invention is shown. The phase indicator module 305 includes pairs of complementary latches each pair being selectively coupled to one of the phase inputs (test clk and test clk1). These latches include a reference pulse rising edge triggered T-type flip-flop 405 and a reference pulse falling edge triggered T-type flip-flop 410. Both flip-flops 405, 410 have a T input coupled to the reference pulse input (Test clk) and their reset inputs (RS) coupled to the reset input (RST) of the phase indicator module 305. Also an output Q of the flip-flop 405 provides the reference pulse input rising edge indicator output (Clk RE) and an output Q of the flip-flop 410 provides the reference pulse input falling edge indicator output (Clk FE).

The phase indicator module 305 further includes further latches in the form of a data pulse rising edge triggered T-type flip-flop 415 and a data pulse falling edge triggered T-type flip-flop 420. Both flip-flops 415, 420 have a T input coupled to the data pulse input (Test clk1) and their reset inputs (RS) coupled to the reset input (RST) of the phase indicator module 305. Also an output Q of the flip-flop 415 provides the data pulse input rising edge indicator output (Clk1 RE) and an output Q of the flip-flop 420 provides the data input pulse falling edge indicator output (Clk1 FE).

Figure 5:
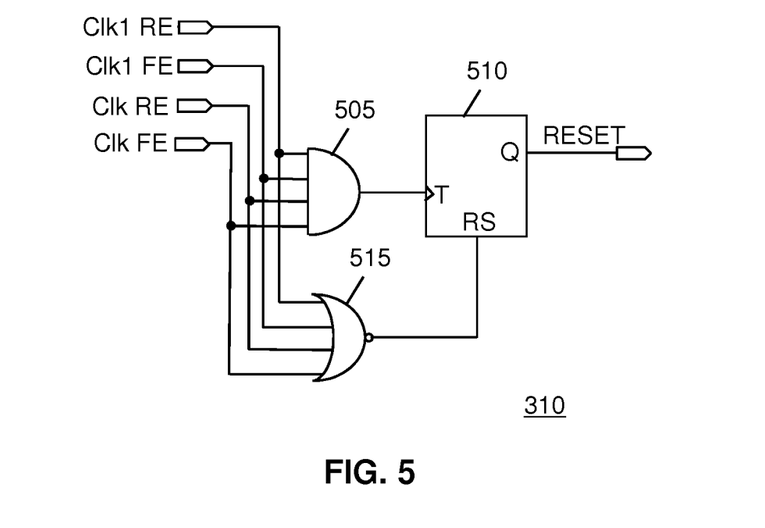
FIG. 5 is a schematic circuit diagram of a cycle reset module of the decoder module of FIG. 3, in accordance with a preferred embodiment of the present invention.

Referring to FIG. 5, a schematic circuit diagram of the cycle reset module 310 in accordance with a preferred embodiment of the present invention is shown. The cycle reset module 310 includes a four input AND gate 505 with an output coupled to a T input of a T-type flip-flop 510. There is also a four input NOR gate 515 with an output coupled to a reset input RS of the T-type flip-flop 510 and an output Q of the T-type flip-flop 510 provides the RESET output of the cycle reset module 310. Furthermore, the inputs of the AND gate 505 and NOR gate 515 are coupled to the timing information outputs (TI) of the phase indicator module 305.

Referring back to FIG. 3, the phase decoder module 315 can be implemented in many different ways and need not have all the inputs as illustrated. In one embodiment the phase decoder module 315 is programmable processor based architecture that processes the logic values at the timing information outputs in response to detection of the leading and trailing pulse edges on one of the phase inputs (Test Clk and Test Clk1). The phase decoder module 315 is programmed to perform the below waveform analysis of the timing information outputs (TI).

When Test Clk=rising edge then
CASE (Clk1 RE, Clk1 FE)
   0,0 : data1=(11 OR 10);
   1,0 :data1=01;
   1,1 :data1=00
END CASE
When Test Clk=falling edge then
CASE (Clk1 RE, Clk1 FE)
   0,0 AND data1=(11 OR 10): BIT1,BIT2=1,1;
   1,0 AND data1=(11 OR 10): BIT1,BIT2=1,0;
   1,1 AND data1=01; : BIT1,BIT2=0,1;
   1,1 AND data1=00; BIT1,BIT2=0,0;
END CASE From the above waveform analysis, it will be apparent that the two decoded binary data outputs (BIT1 and BIT2) are determined by comparing arrival timing information of the reference pulse (CLK RE) and arrival timing information of the data pulse (Test clk1). More specifically, the data outputs (BIT1 and BIT2) are determined by comparing timing information of rising and falling edges of the reference pulse 205 (Test Clk) with the rising and falling edges indicated by Clk1 RE and Clk1 FE. It should be noted however that just the four timing information outputs (Clk RE and Clk FE, Clk1 RE and Clk1 FE) can be used in the above waveform analysis since Clk RE and Clk FE are indicative of the rising and falling edges of the reference pulse 205 (Test Clk). Similarly, other waveform analysis processes can be used by comparing the Clk RE and Clk FE inputs with rising and falling edges of the data pulse 210 (test clk1).

Figure 6:
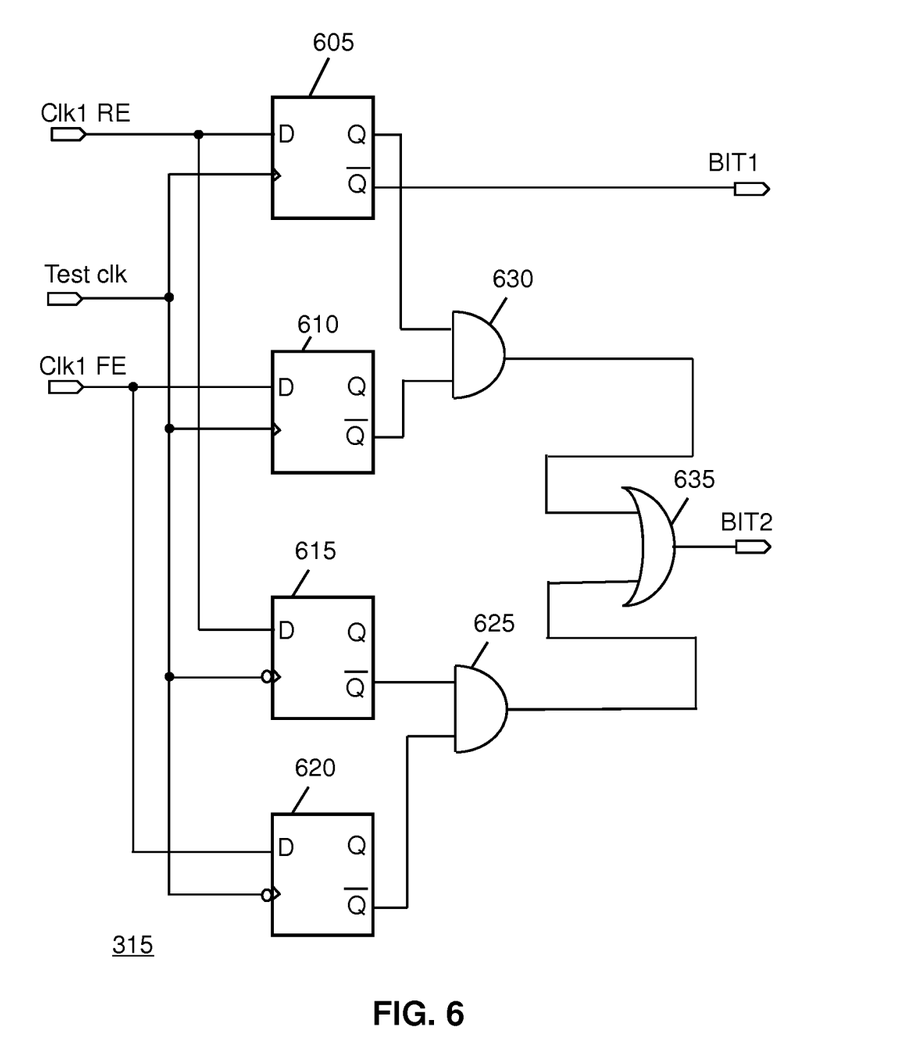
FIG. 6 is a schematic circuit diagram of a phase decoder module of the decoder module of FIG. 3, in accordance with a preferred embodiment of the present invention

In another embodiment the phase decoder module 315 can be a latch based architecture as shown in FIG. 6, which is a schematic diagram of the phase decoder module 315. The phase decoder module 315 includes a rising edge triggered D-type flip-flop 605 with a D input coupled to the data pulse input rising edge indicator output (Clk1 RE) and a rising edge triggered clock input coupled to the reference input (Test clk). A Qbar output of the flip-flop 605 provides the decoded binary data output BIT1. There is also a further rising edge triggered D-type flip-flop 610 with a D input coupled to the data pulse falling edge indicator output (Clk1 FE) and a rising edge triggered clock input coupled to the reference input (Test clk).

The phase decoder module 315 also included two falling edge triggered D-type flip-flops 615, 620. A D input of flip-flop 615 is coupled to the data pulse input rising edge indicator output (Clk1 RE) and the D input of input of flip-flop 620 is coupled to the data pulse input falling edge indicator output (Clk1 FE). The negative edge triggered clock inputs of both flip-flops 610, 615 are also coupled to the reference pulse input (Test clk). The Qbar outputs of both flip-flops 615, 620 are coupled to inputs of an AND gate 625. Also, the Q output of flip-flop 605 and Qbar output of flip-fop 610 are coupled to inputs of an AND gate 630. Outputs of both AND gates 625, 630 are coupled to inputs of an OR gate 635 which has an output providing the decoded binary data output BIT2.

Figure 7:
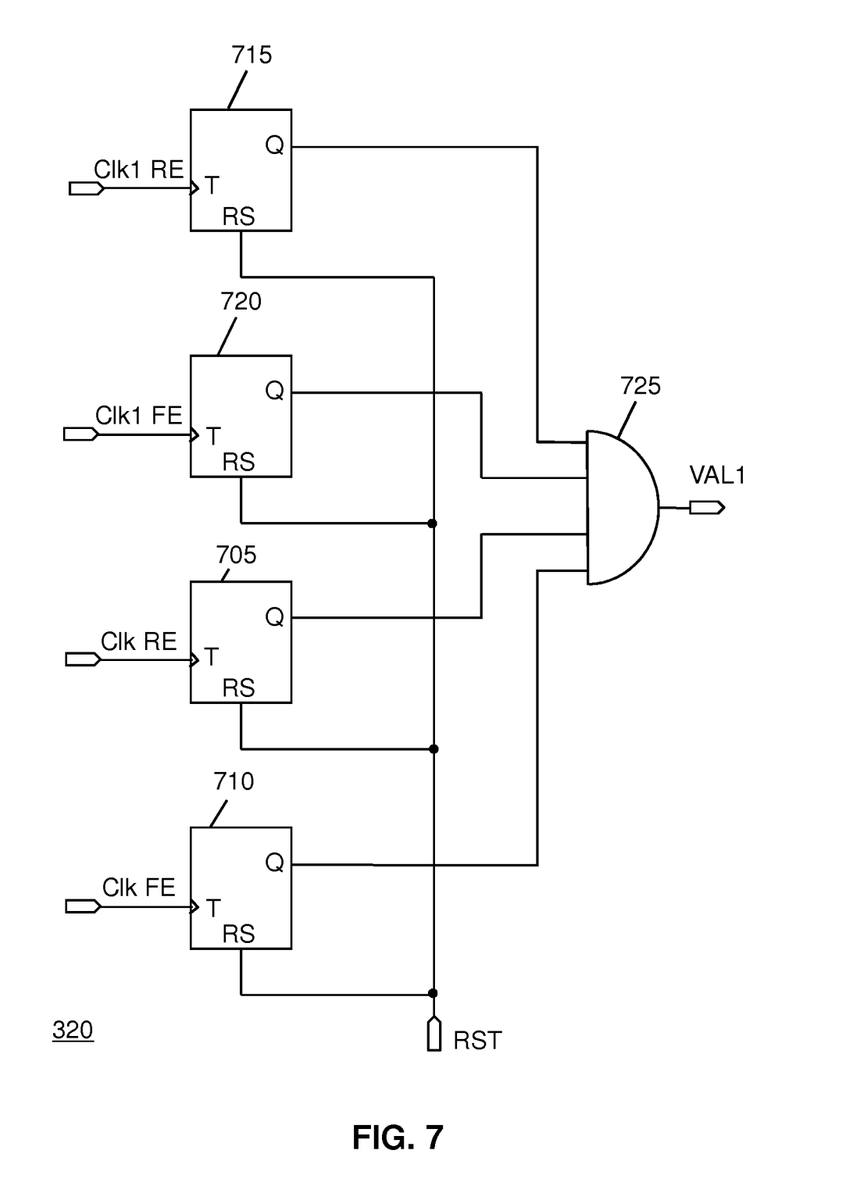
FIG. 7 is a schematic circuit diagram of a phase error indicator module of the decoder module of FIG. 3, in accordance with a preferred embodiment of the present invention.

Referring to FIG. 7, a schematic circuit diagram of the phase error indicator module 320 in accordance with a preferred embodiment of the present invention is shown. The phase error indicator module 320 includes four rising edge triggered T-type flip-flops 705, 710, 715 and 720 each having a T input respectively coupled to one of the timing information outputs (TI), which are:

the reference pulse input rising edge indicator output (Clk RE); the reference pulse input falling edge indicator output (Clk FE); the data pulse input rising edge indicator output (Clk1 RE); and the data pulse input falling edge indicator output (Clk1 FE).

The reset inputs (RS) of the flip-flops 705, 710, 715 and 720 are coupled to the reset input (RST) of the phase indicator module 305, and their Q outputs are coupled to inputs of an AND gate 725. An output of the AND gate 725 provides a VAL1 output for the phase error indicator module 320.

Figure 8:
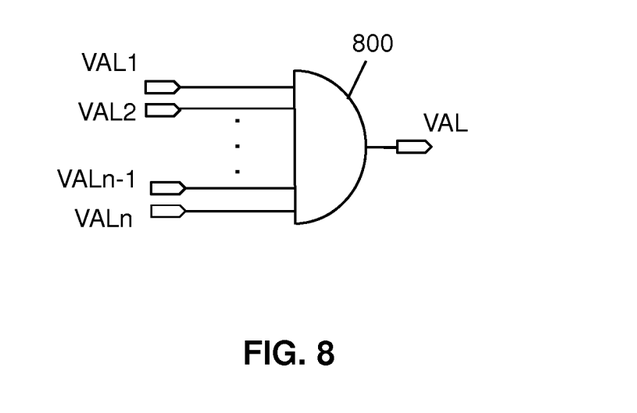
FIG. 8 is a schematic circuit diagram of an output logic gate of a pulse decoder of the circuit of FIG. 1, in accordance with a preferred embodiment of the present invention.

FIG. 8 is a schematic circuit diagram of an output logic gate 800 forming part of the pulse decoder 105 in accordance with a preferred embodiment of the present invention. The logic gate 800 is an n input AND gate where n denotes the number of pulse decoder modules 125 forming the pulse decoder 105. Furthermore, an output of the logic gate 800 forms the valid phase sequence output (VAL) to indicate that a valid phase sequence of pulses has occurred on the inputs (test clk, and test clk1 to test clkn).

Figure 9:
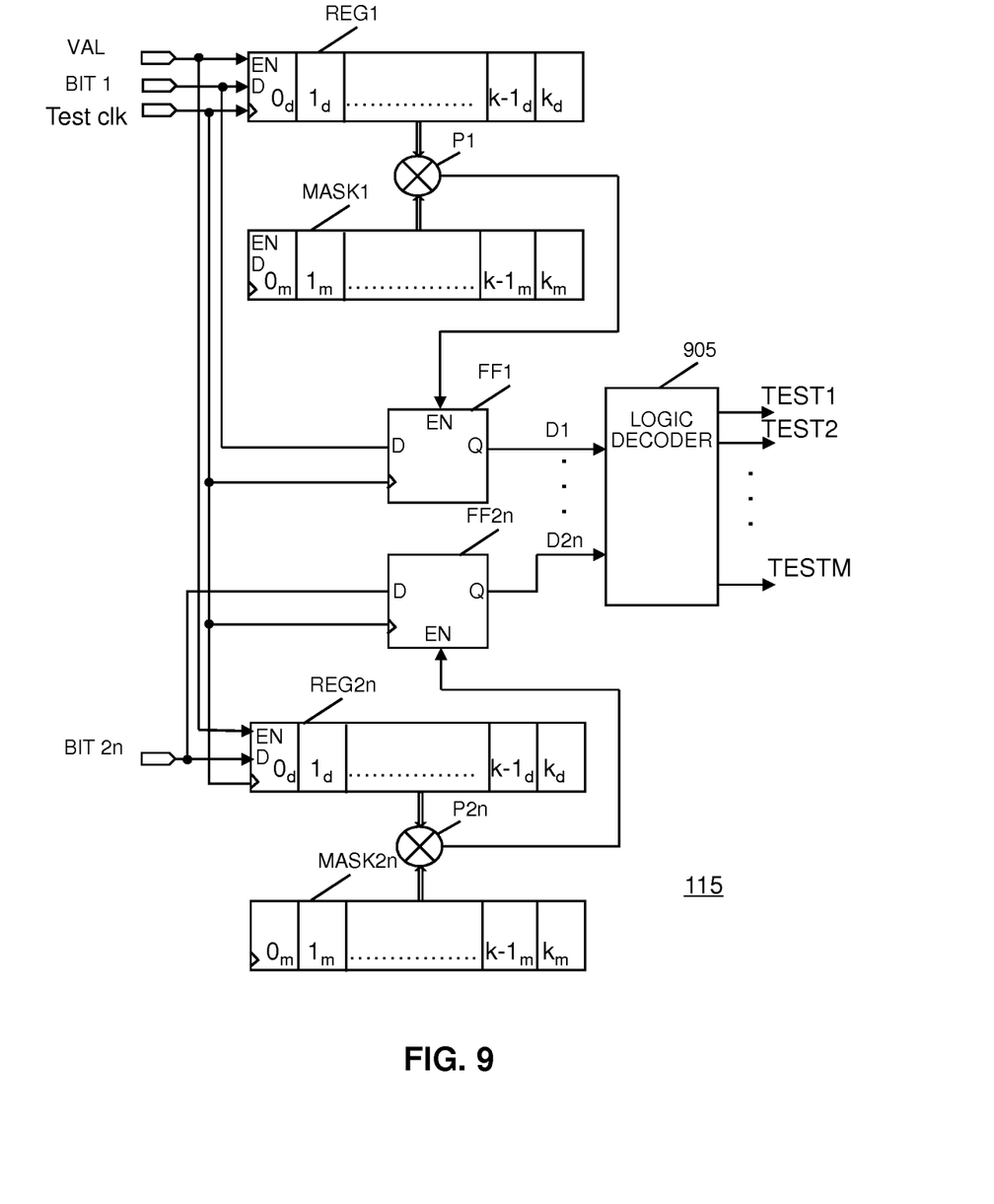
FIG. 9 is a schematic circuit diagram of a test mode selector of the circuit of FIG. 1, in accordance with a preferred embodiment of the present invention.

Referring to FIG. 9, a schematic circuit diagram of the test mode selector 115 in accordance with a preferred embodiment of the present invention is shown. The test mode selector 115 includes a plurality of data input shift registers REG1 to REG2n and corresponding mask registers MASK1 to MASK2n. There is also a plurality of D-type flip-flops FF1 to FF2n. The reference pulse input (Test clk) is coupled to the clock input of each of the data input shift registers REG1 to REG2n and to a clock input of each of the flip-flops FF1 to FF2n. Also, the valid phase pulse sequence signal output (VAL) is coupled to each enable input (EN) of the input shift registers REG1 to REG2n. Furthermore, the decoded binary data outputs (BIT1 to BIT2n) are coupled to respective inputs (D) of the input shift registers REG1 to REG2n. Thus, it will be apparent to a person skilled in the art that the decoded binary data outputs (BIT1 to BIT2n) associated with an reference pulse 205 on the reference pulse input (Test clk), will only be clocked into the input shift registers REG1 to REG2n on the next rising edge of the reference pulse.

Each output bit of each of the data input shift registers REG1 to REG2n, and each output bit of the corresponding mask registers MASK1 to MASK2n, are coupled to inputs of respective comparators P1 to P2n. It will thus be apparent to a person skilled in the art that the data input shift registers REG1 to REG2n and corresponding mask registers MASK1 to MASK2n have a bit width of K bits. An output of each comparator P1 to P2n is coupled to an enable input (EN) of a respective one of the D-type flip-flops FF1 to FF2n. Each mask register contains a pre-defined (or user programmable) bit sequence for each data bit. When the k data bits in every shifter register (REG1 to REG2n) is equal to the corresponding k mask bits in the MASK registers (MASK1 to MASK2n), the next respective data bits received from phase decoder will be latched into the D-type flip-flops FF1 to FF2n. Also outputs D1 to D2n of the D-type flip-flops FF1 to FF2n are coupled to inputs of a logic decoder 905 that provides test mode outputs TEST1 to TESTM. The logic decoder 905 is a typical decoder which in this embodiment includes decoding AND gates (not illustrated) each providing a respective one of the test mode outputs TEST1 to TESTM. Also, inputs of each decoding AND gate are coupled directly or via an Inverting gate (NOT gate) to one of the outputs D1 to D2n of the D-type flip-flops FF1 to FF2n.

Figure 10:
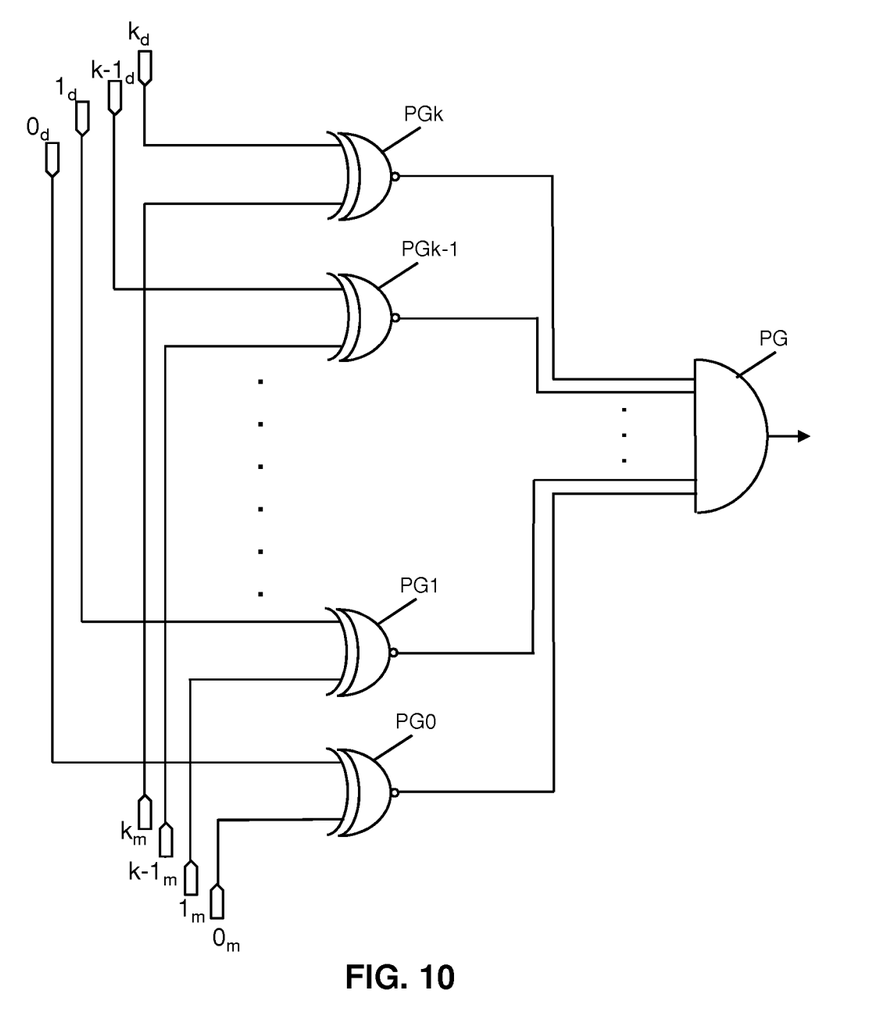
FIG. 10 is a schematic circuit diagram of a comparator of the selector of FIG. 9, in accordance with a preferred embodiment of the present invention.

FIG. 10 is a schematic circuit diagram of one of the comparators P1 to P2n. The illustrated comparator P1 includes a plurality of two input XNOR gates PG0 to PGk, each having one input coupled to a bit output of the input shift register REG1 and the second input coupled to a respective bit output of the mask register MASK1. All outputs of the XNOR (parity) gates PG0 to PGk, are coupled to inputs of a AND gate PG that has an output providing the output of the comparator P1.

Figure 11:
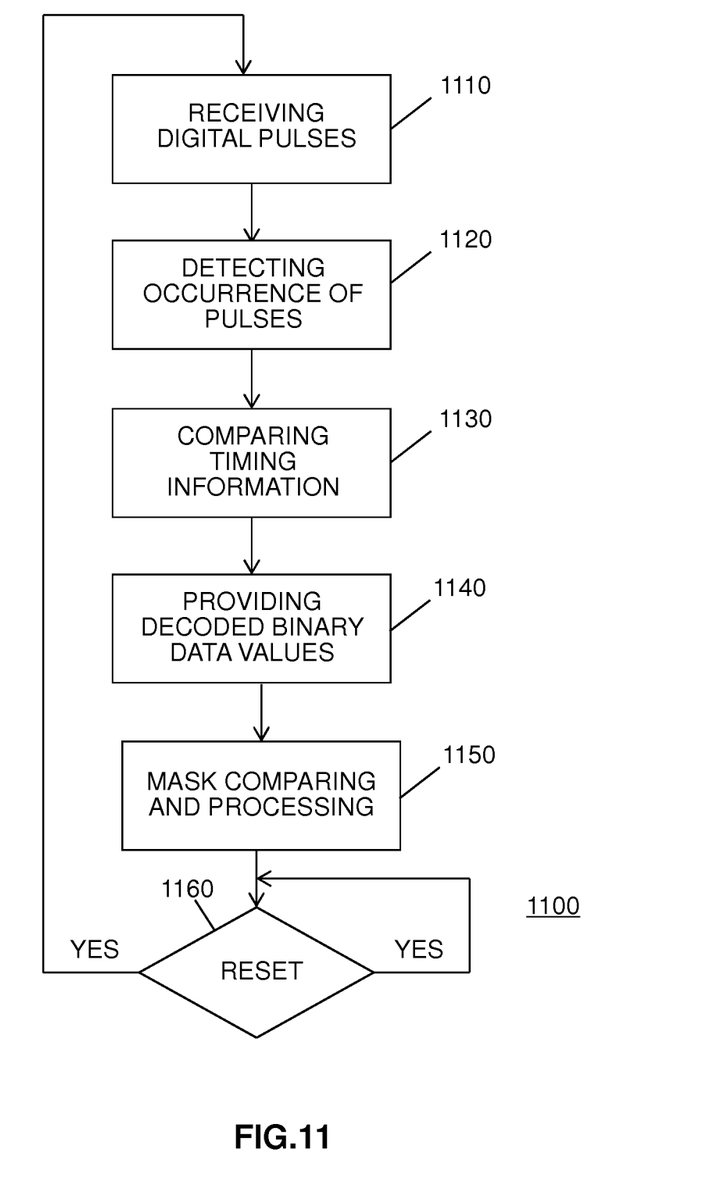
FIG. 11 is a flow chart illustrating a method of decoding digital pulses in accordance with a preferred embodiment of the present invention.

Referring to FIG. 11, a flow chart of a method 1100 of decoding digital pulses received at phase inputs of a decoder in accordance with a preferred embodiment of the present invention is shown. By way of illustration only the method 1100 will be described, where necessary, with reference to the embodiments of FIGS. 1 to 10. The method 1100 at a receiving block 1110 receives digital pulses at phase inputs of the pulse decoder 105, the digital pulses being the reference pulse 205 and the data pulse 210. The method 1100 then, at a detecting block 1120, performs a process of detecting an occurrence of the reference pulse 205 received at one of the inputs (Test Clk) and the data pulse 210 received at another of the inputs (Test Clk1).

The process of detecting is performed by the phase indicator modules 125, such that the T-type flip-flops 405, 410, 415 and 420 latch in logic values indicative of the rising and falling edges of the reference pulse 205 and data pulse 210. Hence, the timing information outputs of the phase indicator modules 305 provide logic values indicative of rising and falling edges of pulses occurring on the reference input (Test Clk) the data pulse input (Test Clk1).

At a comparing block 1130 there is performed a process of comparing arrival timing information of the reference pulse 205 and arrival timing information of the data pulse 210 to determine a pulse arrival order sequence. As will be apparent to a person skilled in the art, the pulse arrival order sequence is related to the arrival times of the pulse's leading edges. Also at the comparing block 1130 there is performed a process of comparing termination timing information of the reference pulse 205 and termination timing information of the data pulse 210 in order to determine a pulse termination sequence. Thus the pulse termination sequence is related to the arrival times of the pulse's trailing edges.

The comparing is conducted by the phase decoder module 315 that compares at least two of the logic values at the timing information outputs (TI) with a signal representative a leading and a trailing edge of a pulse applied to one of the phase inputs (e.g., Test Clk or Test Clkn). This determines a pulse arrival order sequence on the phase inputs and thereby provides the decoded binary data values (BIT1 to BIT2n). Typically, the in operation, the phase decoder module 315 compares the logic values at the timing information outputs of the phase indicator 305, in response to a leading and a trailing edge being detected on a respective one of the phase inputs (as described above).

The method 1100 then, at a providing block 1140, performs a process of providing decoded binary data values at outputs of the decoder 105 (BIT1 to BIT2n), the decoded binary data values being dependent the above comparing of the pulse arrival order sequence and termination sequence.

At a mask comparing and processing block 1150, there is performed comparing at least one sequence of the decoded binary data values with a bit or bits of the mask registers (mask1 to mask2n) to provide a processing enabling signal. Then, processing block 1150 performs processing a further bit (a decoded binary data value) in the pulse arrival order sequence to control a function of the functional module 120, wherein the processing is in response to the enabling signal. In other words if there is a mask match the test mode selector 115 processes a further one of decoded binary data values to determine and send a control command to the functional module or modules 120. However, if there is no mask match then the functional modules 120 function in normal non-test mode.

The control command, in operation, controls the functional module 120 to be configured in a test mode. For instance possible test modes are:
Test1. Basic scan mode test
Test2. IDDQ scan mode test.
Test3. Burn-in scan mode for burn-in test.
Test4. Probe scan mode.
Test5. RAMBIST for RAM BIST.
Test6. NVMBIST for flash BIST.
Test7. Functional test.
TestM. RAMLODER mode used to load a RAM.

At a test block 1150 the method 1100 waits until there is a RESET signal from the output of the cycle reset module 310. Upon detection of the reset signal the above processes 1110 to 1150 are repeated to create at sequences of the decoded binary data values at the outputs of the decoder 105 (BIT1 to BIT2n) that are compared against a mask and processed at block 1150.

Advantageously, the present invention provides for allowing logic levels or pulses to be applied to the phase pulse inputs (Test Clk, Test Clk1 to Test Clkn) and also, if required, to other inputs of the circuit 100 so that the functional modules 120 operate in a non-test mode. However, if a specific test mode is required, then pulses are applied to the phase pulse inputs (Test Clk, Test Clk1 to Test Clkn) in a necessary sequence so that they are decoded into the decoded binary data outputs (BIT1 to BIT2n). In one embodiment these pulse can be of a set or known duration, however, in other embodiments the duration of the pulses are unknown by the decoder.

The decoded binary data outputs (BIT1 to BIT2n) activate and control the test mode selector to provide control commands to DFT circuitry associated with the functional modules 120. These control commands reconfigure the functional modules 120 into a selected test mode and when required another selected sequence can be applied to the phase pulse inputs to reconfigure the functional modules 120 into non-test mode. The probability of an undesirable false triggering of a test mode being selected is reduced by increasing the bit width of K bits in the input shift registers REG1 to REG2n; or increasing the number data input shift registers REG1 to REG2n; or a combination of both. Thus the present invention eliminates or at least reduces the need for specifically assigned dedicated test pins that provide no other circuit function.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of decoding digital pulses received at phase inputs of a decoder, digital pulses being a reference pulse and at least one data pulse, the method comprising:
    detecting an occurrence of the reference pulse received at one of the inputs and the data pulse received at another of the inputs;
    comparing arrival timing information of the reference pulse and arrival timing information of the data pulse to determine a pulse arrival order sequence; and providing decoded binary data values at outputs of the decoder, the decoded binary data values being dependent on at least the pulse arrival order sequence.

2. The method of claim 1, wherein the comparing also compares termination timing information of the reference pulse and termination timing information of the data pulse in order to determine a pulse termination sequence.

3. The method of claim 2, wherein the providing includes processing the pulse termination sequence and wherein the decoded binary data values are dependent on the pulse termination sequence.

4. The method of claim 3, further comprising repeating the detecting, comparing and providing to create at least one sequence of the decoded binary data values.

5. The method of claim 4, further comprising:
comparing at least one of the sequences of the decoded binary data values with a mask bit to provide a processing enabling signal; and
processing a further bit of at least one of the sequences to control a function of a digital circuit, wherein the processing is in response to the enabling signal.

6. The method of claim 5, wherein the function is a test function for configuring a circuit to perform a test operation thereon.

7. A digital pulse decoder with at least two phase inputs in the form of a reference pulse input and a data pulse input, the decoder including:
a phase indicator module having inputs coupled to the reference pulse input and the data pulse input, wherein the phase indicator module has timing information outputs that provide logic values indicative of rising and falling edges of pulses occurring on the reference pulse input and the data pulse input; and
a phase decoder module having inputs coupled to the timing information outputs, and outputs that provide decoded binary data values, and wherein in operation the phase decoder module compares at least two of the logic values at the timing information outputs with a signal representative a leading and a trailing edge of a pulse applied to one of the phase inputs to determine a pulse arrival order sequence on the phase inputs and thereby provides the decoded binary data values.

8. The digital pulse decoder of claim 7, wherein in operation the phase decoder module compares the logic values at the timing information outputs in response to the leading and a trailing edge being detected on a respective one of the phase inputs.

9. The digital pulse decoder of claim 8, wherein the designated pulse edges include leading and trailing pulse edges of a reference pulse on the reference pulse input, and wherein the phase decoder module compares the logic values at the timing information outputs on both the leading and trailing pulse edges in order to provide the decoded binary data values.

10. The digital pulse decoder of claim 9, wherein the phase indicator module includes pairs complementary latches each pair selectively coupled to one of the phase inputs.

11. The digital pulse decoder of claim 7, wherein the phase decoder module includes a processor based architecture that processes the logic values at the timing information outputs in response to detection of the leading and trailing pulse edges.

12. The digital pulse decoder of claim 7, wherein the phase decoder module includes a latch based architecture that processes the logic values at the timing information outputs in response to detection of the leading and trailing pulse edges on at least one of the phase inputs.

13. A reconfigurable circuit including a digital pulse decoder and at least one functional module providing at least some outputs of the circuit, the circuit having at least two phase inputs in the form of a reference pulse input and a data pulse input coupled to inputs of both the digital pulse decoder and at least one functional module, wherein the digital pulse decoder includes:
a phase indicator module having inputs coupled to the reference pulse input and the data pulse input, wherein the phase indicator module has timing information outputs that provide logic values indicative of rising and falling edges of pulses occurring on the reference pulse input and the data pulse input; and
a phase decoder module having inputs coupled to the timing information outputs, and outputs that provide decoded binary data values, and wherein in operation the phase decoder module compares at least two of the logic values at the timing information outputs with a signal representative a leading and a trailing edge of a pulse applied to one of the phase inputs to determine a pulse arrival order sequence on the phase inputs and thereby provide the decoded binary data values.

14. The reconfigurable circuit of claim 13, wherein in operation the phase decoder module compares the logic values at the timing information outputs in response to the leading and a trailing edge being detected on a respective one of the phase inputs.

15. The reconfigurable circuit of claim 14, wherein the designated pulse edges include leading and trailing pulse edges of a reference pulse on the reference pulse input, and wherein the phase decoder module compares the logic values at the timing information outputs on both the leading and trailing pulse edges in order to provide the decoded binary data values.

16. The reconfigurable circuit of claim 15, further comprising a test mode selector with inputs coupled to the outputs of the phase decoder module, and wherein the outputs of the phase decoder module are coupled to inputs of a test mode selector and outputs of the test mode selector are coupled to the functional module.

17. The reconfigurable circuit of claim 16, wherein in operation the test mode selector sends control commands to reconfigure the functional module into a test mode.

18. The reconfigurable circuit of claim 17, wherein in operation the test mode selector compares the decoded binary data values with a mask to determine a mask match, and if there is a mask match the test mode selector processes a further one of decoded binary data values to determine and send a control command to the functional module.

19. The reconfigurable circuit of claim 18, wherein the test mode selector includes a plurality of shift registers each associated with a mask register that stores a unique digital mask code.

20. The reconfigurable circuit of claim 18, wherein the functional module operates in a non-test mode thereby processing digital data received at the phase inputs until the control command is sent to the functional module.

* * * * *